US011221643B2

(12) United States Patent
Malevsky et al.

(10) Patent No.: US 11,221,643 B2
(45) Date of Patent: Jan. 11, 2022

(54) MID POWER MODE FOR AN OSCILLATOR

(71) Applicant: Apple Inc., Cupertino, CA (US)

(72) Inventors: Sharon Malevsky, Tel Aviv (IL); Tomer Gidoni, Petach-Tikva (IL); Shahar Porat, Ein Carmel (IL); Ayal Eshkoli, Kiryat Tivon (IL); Tom Romano, Tel Aviv (IL); Johannes Brendel, Erlangen (DE); Stefan Meyer, Hoechstadt (DE)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 16/080,464

(22) PCT Filed: Sep. 28, 2017

(86) PCT No.: PCT/US2017/053918
§ 371 (c)(1),
(2) Date: Aug. 28, 2018

(87) PCT Pub. No.: WO2019/066842
PCT Pub. Date: Apr. 9, 2019

(65) Prior Publication Data
US 2021/0200258 A1   Jul. 1, 2021

(51) Int. Cl.
*H03L 5/02* (2006.01)
*G06F 1/10* (2006.01)
(Continued)

(52) U.S. Cl.
CPC ............... *G06F 1/10* (2013.01); *G06F 1/324* (2013.01); *H03B 5/366* (2013.01); *H03L 5/02* (2013.01);
(Continued)

(58) Field of Classification Search
CPC . G06F 1/10; G06F 1/32; G06F 1/3203; G06F 1/3206; G06F 1/3237; G06F 1/324;
(Continued)

(56) References Cited

U.S. PATENT DOCUMENTS

2004/0023680 A1\* 2/2004 Hulvey ................... G06F 1/325
455/522
2005/0007205 A1   1/2005 Bridger
(Continued)

FOREIGN PATENT DOCUMENTS

WO   2008/139275 A1   11/2008
WO   2011/150423 A1   12/2011

OTHER PUBLICATIONS

International Preliminary Report on Patentability dated Mar. 31, 2020 for International Application PCT/US2017/053918.
International Search Report dated Jun. 18, 2018 for International Application PCT/US2017/053918.

*Primary Examiner* — Levi Gannon
(74) *Attorney, Agent, or Firm* — Eschweiler & Potashnik, LLC

(57) ABSTRACT

Methods, systems, and circuitries are provided to generate clock signals of different qualities in a device. A method includes determining whether the device is operating in a mid power mode or a high power mode. In response to determining that the device is operating in the mid power mode, oscillator circuitry is controlled to cause the oscillator circuitry to consume a lower amount of power, such that the oscillator circuitry generates a lower quality clock signal. In response to determining that the device is operating in the high power mode, the oscillator circuitry is controlled to cause the oscillator circuitry to consume a higher amount of power, such that the oscillator circuitry generates a higher quality clock signal. The lower amount of power and the higher amount of power are different from one another.

19 Claims, 6 Drawing Sheets

(51) Int. Cl.
*G06F 1/32* (2019.01)
*H03B 5/32* (2006.01)
*H04W 52/02* (2009.01)
*G06F 1/324* (2019.01)
*H03B 5/36* (2006.01)

(52) U.S. Cl.
CPC ..... H04W 52/02 (2013.01); *H03B 2200/0082* (2013.01)

(58) Field of Classification Search
CPC ... H03B 5/30; H03B 5/32; H03B 5/36; H03B 5/362; H03B 5/364; H03B 5/366; H03B 5/368; H03B 2200/0082; H03B 2200/0088; H03B 2200/009; H03B 2202/042; H03L 5/00; H03L 5/02; H04W 52/02; H04W 52/0225
USPC .................................. 331/154, 158, 185, 186
See application file for complete search history.

(56) References Cited

U.S. PATENT DOCUMENTS

| | | | |
|---|---|---|---|
| 2007/0082716 A1* | 4/2007 | Behzad | H04W 52/0261 455/574 |
| 2011/0018604 A1 | 1/2011 | Chang et al. | |
| 2011/0292855 A1* | 12/2011 | Saha | G06F 1/3203 370/311 |
| 2012/0068780 A1 | 3/2012 | Chang et al. | |
| 2013/0057356 A1* | 3/2013 | Houssameddine | H03L 7/26 331/177 R |
| 2013/0171953 A1* | 7/2013 | Kuo | H03B 5/366 455/255 |
| 2014/0327487 A1* | 11/2014 | Chataigner | H03B 5/1262 331/117 FE |
| 2014/0337647 A1* | 11/2014 | Jiang | G06F 1/08 713/322 |
| 2016/0308491 A1* | 10/2016 | Elgaard | H03B 5/32 |

* cited by examiner

MID POWER MODE FOR AN OSCILLATOR

RELATED APPLICATIONS

This application is a National Phase entry application of International Patent Application No. PCT/US2017/053918 filed Sep. 28, 2017, entitled "MID POWER MODE FOR AN OSCILLATOR" in the name of Sharon Malevsky et al. and is hereby incorporated by reference in its entirety.

BACKGROUND

Power consumption is an important characteristic of communication devices. One component that consumes a significant amount of power is the crystal oscillator (XO) block. The XO block is responsible for generating and distributing analog and digital reference clock signals used by internal and external processing modules. The quality of the clock signals (e.g., jitter) generated by the XO block is an important key performance indicator.

As modern communication systems (e.g., wireless fidelity (WiFi), cellular modems, and so on) evolve toward more complex constellations, higher bandwidths and throughput, XO jitter specifications are hardened. To provide the higher quality clock signals demanded by the more rigorous jitter specifications, the current supplied to the XO block (e.g., a power regulator that provides power to various XO block components) is increased. This increased power draw by the XO block significantly reduces the battery life of the device and degrades the power consumption in general.

DETAILED DESCRIPTION

Communication devices typically have two different XO blocks. A low frequency XO block (e.g., at or around 32 kHz) is used during "sleep" phases of the device, such as when no signals or a predetermined number of signals below a predetermined threshold are being processed by digital, analog or "mixed signal" (hereinafter referred to as simply "analog" for shorthand), or radio frequency (RF) circuits in the device. A high frequency XO block (e.g., at or around 38.4 Mhz) is used at any time any of the circuits are active. For the purposes of this description, when the device is not in sleep mode, the device will described as being "active". When the device is active, the high frequency XO block is used.

When the power supplied to the XO block is increased to support modern communication standards, the power consumption of the device may be unnecessarily increased when the device is operating at legacy rates (for example, less than modulation coding scheme 7 (MCS7)). Further, the power consumption of connectivity application circuitries (e.g., Bluetooth and WiGig cores) may be unnecessarily increased. This renders the device less competitive, especially for battery powered platforms or mobile devices. Put another way, there are various operating scenarios during which the device is active but does not require that the high frequency XO block be provided with the high current levels associated with meeting the modern communication standards. Thus, during these operating scenarios, power supplied to the high frequency XO block is being wasted.

Described herein are systems, methods, and circuitries that provide at least two discrete power states in hierarchy (as opposed to the standard single power state) for the XO block (hereinafter "the oscillator circuitry"). By having at least two different power states in hierarchy, the amount of power provided to the oscillator circuitry can be determined based on the quality of the clock signal appropriate to the device's mode of operation. When the device is active but is operating in a "mid power mode" that does not call for the highest quality clock signal, a lower amount of power is supplied to the oscillator circuitry, yielding a clock signal of sufficient quality while reducing the power consumption of the device. When the device transitions to a "high power mode" that does call for the highest quality clock signal, a transition can be made to a high power state in which a higher amount of power is supplied to the oscillator circuitry, yielding a clock signal of the highest quality while limiting the amount of time spent in the high power state. Further, examples are described in which the transition between the mid power state and the high power state can occur in less than 400 nanoseconds, meaning that the oscillator circuitry power modes can be switched on a per packet basis.

Figure 1:
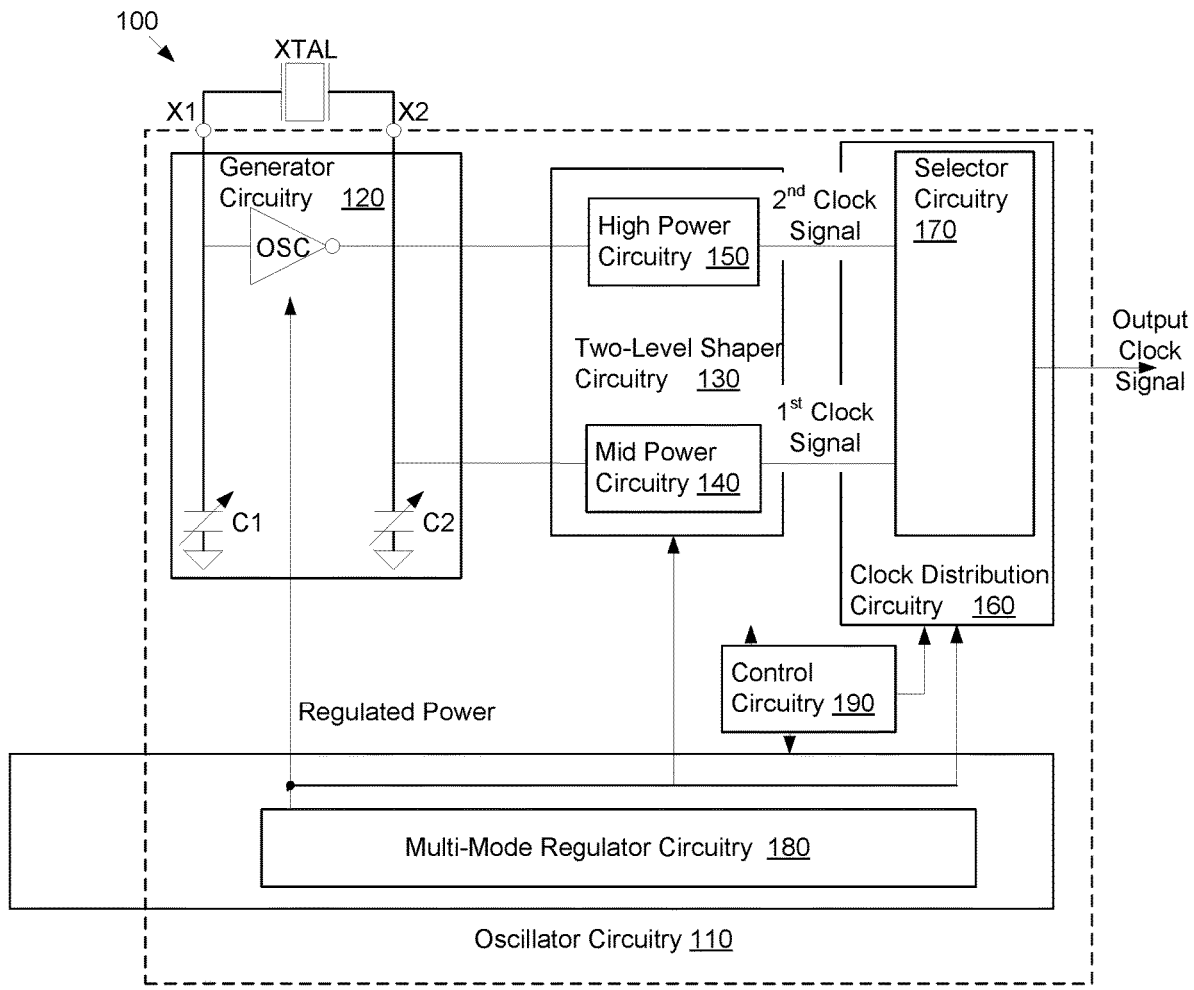
FIG. 1 illustrates an example clock signal generation system that provides clock signals of two different qualities in accordance with various aspects described.

FIG. 1 illustrates an example clock signal generation system 100 that includes oscillator circuitry 110 that is capable of operation in at least two different power states in hierarchy. A mid level power state has a first priority and is the "default" power state and a high level power state has a second priority and is enabled when operating conditions justify the additional power consumption of the high power state. The system 100 generates a first clock signal when the oscillator circuitry 110 is in a mid power state and a second clock signal when the oscillator circuitry 110 in a high power state. The system 100 outputs the first clock signal and/or the second clock signals as an output clock signal(s). The first clock signal has a lower quality as compared to the second clock signal. Clock signal quality may be defined in terms of jitter, the sharpness of the edges of pulses in the clock signal, or any other parameter.

The oscillator circuitry 110 includes generator circuitry 120 and two-level shaper circuitry 130. The generator circuitry 120 includes an oscillator amplifier OSC that drives a crystal XTAL to generate a sinusoidal signal having a predetermined frequency. The oscillator amplifier is powered by regulated power output by the multi-mode regulator circuitry 180. The regulated power will be of differing qualities, depending on the power state of the system 100 as selected by the control circuitry 190.

The oscillator circuitry 110 also includes clock distribution circuitry 160, multi-mode regulator circuitry 180, and control circuitry 190. The control circuitry 190 determines a mode of operation of a device (not shown) that includes the system 100 and uses the clock signals generated by the system. Based on the device's mode, the control circuitry 190 selects a power state for the system 100 (i.e., either mid power or high power, and, in some examples additional power states may be provided). The multi-mode regulator circuitry 180 is controlled by the control circuitry 190 to provide one of two different levels of regulated power. The two levels are described herein as a "lower level" of power when the system 100 is in a mid power state and a "higher level" of power when the system 100 is in a high power state.

In one example, the regulated power supplied by the multi-mode regulator circuitry 180 to the generator circuitry 120 and the two-level shaper circuitry 130 is the same (e.g. 1.1 volts) in both power states. However, in the mid power state a quality (e.g., power) ratio setting for the multi-mode regulator circuitry 180 is reduced, meaning that the "lower amount of power" can be provided to the multi-mode regulator circuitry 180 such that the multi-mode regulator circuitry 180 outputs a more "noisy" regulated power (referred to herein as the "mid power level"). In the high power state, the quality setting is increased, meaning that the "higher amount of power" should be provided to the multi-mode regulator circuitry 180 such that the multi-mode regulator circuitry 180 outputs a less noisy regulated power (referred to herein as the "high power level"). Thus, the term "power level" implies a quality of power that is delivered to oscillator circuitry components rather than an amount of power. The term "amount of power" refers to the amount of power consumed by the multi-mode regulator circuitry 180 and not necessarily an amount of power supplied by the multi-mode regulator circuitry 180 to other components in the oscillator circuitry 110.

The two-level shaper circuitry 130 shapes the sinusoidal signal output by the generator circuitry 120 into a series of pulses having the same frequency as the sinusoidal signal. The two-level shaper circuitry 130 is powered by the multi-mode regulator circuitry 180 with either the mid level of regulated power or the high level of regulated power, depending on the selected power state of the system 100. The two-level shaper circuitry includes mid power circuitry 140 and high power circuitry 150. The mid power circuitry 140 is activated (i.e., by the control circuitry 190) to generate the first clock signal when the system 100 is in the mid power state in which the mid level of power is provided to the two-level shaper circuitry 130. The high power circuitry 150 is activated when the system 100 is in the high power state in which the higher level of power is provided to the two-level shaper circuitry 130. The first clock signal is of a lower quality than the second clock signal because a lower quality power is supplied to the mid power circuitry than the high power circuitry.

The clock distribution circuitry 160 includes selector circuitry 170 that is controlled by the control circuitry 190 to select either the first clock signal (i.e., when the system is in the mid power state) or the second clock signal (i.e., when the system is in the high power state). The clock signal selected by the selector circuitry 170 is the output clock signal of the system 100.

Figure 2:
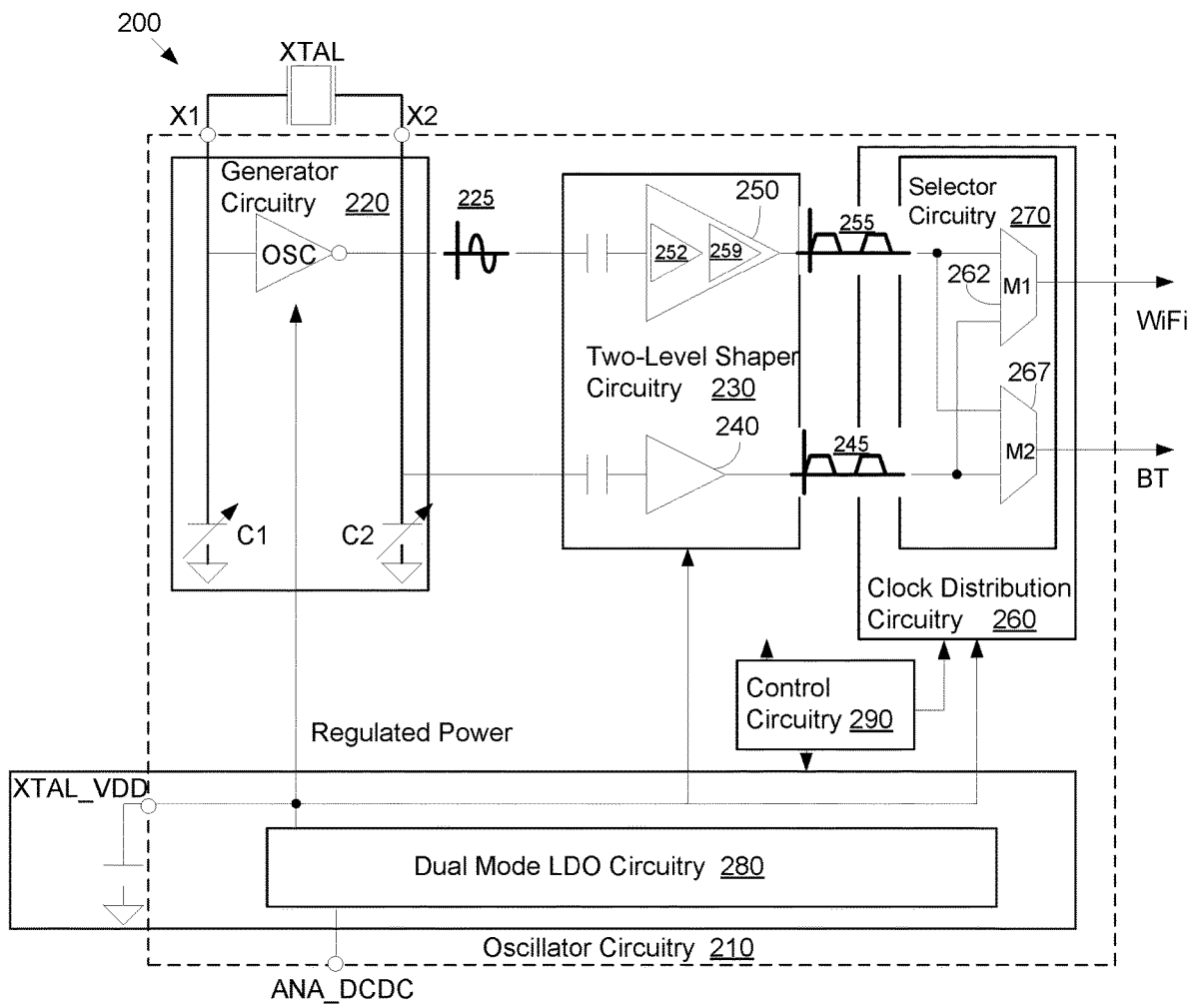
FIG. 2 illustrates another example clock signal generation system that provides clock signals of two different qualities in accordance with various aspects described.

FIG. 2 illustrates an example clock signal generation system 200 that includes oscillator circuitry 210. The oscillator circuitry 210 includes generator circuitry 220, two-level shaper circuitry 230, clock distribution circuitry 260, dual mode low dropout (LDO) circuitry 280, and control circuitry 290. The dual mode LDO circuitry 280 receives source power (ANA_DCDC) and regulates the source power to provide at least two different levels of power (e.g., mid power level and high power level) to the generator circuitry 220, the two-level shaper circuitry 230, and the clock distribution circuitry 260. In this manner, the dual mode LDO circuitry 280 isolates the other components in the oscillator circuitry 210 from noise that originates from the external capacitor source. An external capacitor (XTAL_VDD) is used for adjusting the noise suppression of the dual mode LDO circuitry 280 and as a decoupling mechanism. The dual mode LDO circuitry 280 includes two LDOs, a mid-power LDO that consumes less power and produces the mid level power and a high-power LDO that consumes more power and produces the high level power (see, e.g., FIG. 3).

The noise performance of the dual mode LDO circuitry 280 is important since the two-level shaper circuitry 230 will convert the noise to jitter. As will be described in more detail with reference to FIGS. 3 and 4, the dual mode LDO circuitry 280 is controlled by the control circuitry 290 to supply either the mid level of power or the high level of power to the oscillator circuitry and/or the clock distribution circuitry 290 based on a determined operation mode of the device.

In one example, the generator circuitry 220 interfaces to an external crystal die (holding crystal XTAL) on a circuit board (indicated by dashed line). The generator circuitry 220 generates an oscillation at a given frequency determined by the equivalent circuit of the external crystal XTAL. The output of the generator circuitry 220 is a signal 225 comprising a sine wave or a clipped sine wave. The generator circuitry 220 includes capacitors C1, C2 to compensate for initial frequency shifts introduced by the external crystal XTAL.

The two-level shaper circuitry 230 rectifies the signal 225 to generate a square wave (or series of pulses) clock signal. The two level shaper circuitry 230 includes a mid power amplifier 240 and a high power amplifier 250. During mid power state operation the amplifier 250 is powered down and the amplifier 240 is powered with the mid level of power from the dual mode LDO circuitry 280. The first clock signal 245 generated by the amplifier 240 is selected by selector circuitry 270 as the output clock signal for both a WiFi application circuitry and a Bluetooth application connectivity circuitry (clock signals for cellular connectivity application circuitry may also be generated). Of course, other application connectivity circuitries as well as any number of device components may also be receiving a clock signal from the system 200.

When the system 200 transitions to the high power state, the amplifier 250 is powered up with the high level of power from the dual mode LDO circuitry 280. In one example, the enabling/disabling of the amplifier 250 is synchronized to the reference clock and delayed by ¼ phase to ensure that the enable/disable does not happen around the clock transition points. During the transition, and in one example during operation in high power mode, both the amplifier 240 and the amplifier 250 are powered on and generating clock signals. This simplifies the clock route and control scheme.

To smooth the transition between the mid power state and the high power state, in one example the amplifier 250 is separated into two stages 252 and 259. Each stage can be separately enabled/disabled. Upon a request to transition to the high power state (e.g., by way of a signal from mode control circuitry 392 of FIG. 3), the stage 259 is enabled and after the transient has settled the stage 252 is enabled. The reverse is performed upon a request to transition from the high power state to the mid power state. This process is described in more detail with reference to FIG. 3.

Once the high power amplifier is generating an acceptable second clock signal, the selector circuitry 270 switches the output clock signal to the second clock signal. In one example, the selector circuitry 270 may continue to route the first clock signal to circuitries (e.g., cores) that can utilize the lower quality (e.g., higher phase noise) first clock signal. While two multiplexers M1 and M2 are shown as selecting one of the clock signals as an output clock signal for a WiFi and a Bluetooth application circuitry, respectively, any number or manner selector switches may be employed to route one of the generated clock signals to various circuits.

Because the mid power shaper amplifier 240 and the high power shaper amplifier 250 are both connected to the generator circuitry 220 in parallel the generator circuitry 220 sees the same capacitive load regardless of which amplifier is active. Both circuitries 240, 250 have shared load and bias control (see also FIG. 3). The control circuitry 290 controls the transition between the mid power state and the high power state to be smooth, fast, and glitch-less to allow for on-the-fly transitioning between power states, even on an individual packet basis (see FIG. 3).

Figure 3:
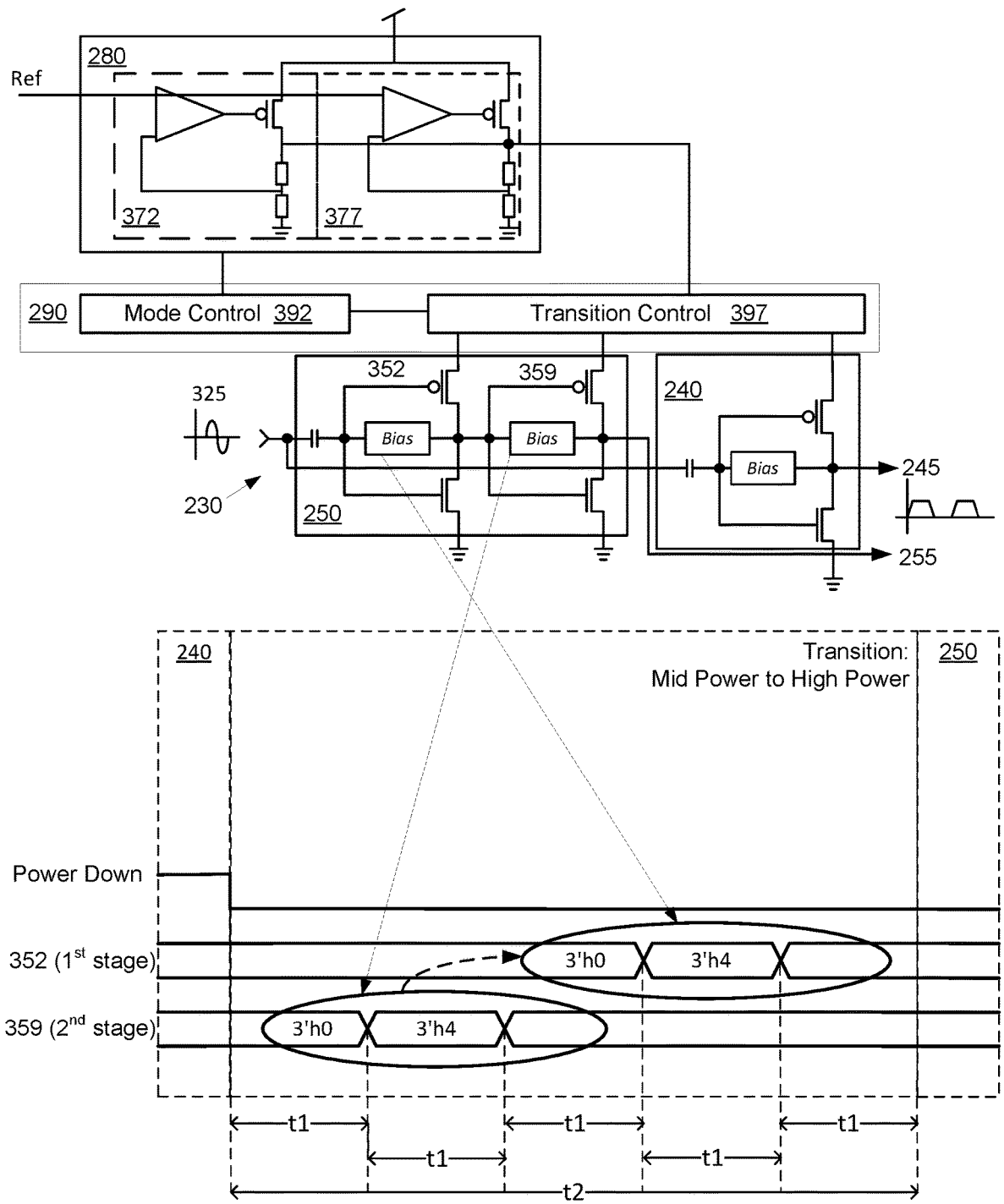
FIG. 3 illustrates an example control circuitry of the clock signal generation system of FIG. 2.

FIG. 3 illustrates the dual mode LDO circuitry 280, the control circuitry 290, and the two-level shaper circuitry 230 of FIG. 2 in more detail. The dual mode LDO circuitry 280 includes a mid-power LDO 372 that regulates the source power to output the mid power level. A high-power LDO 377 regulates the source power to output the high power level. The control circuitry 290 includes mode control circuitry 392 and transition control circuitry 397. The mode control circuitry selects between the mid power level and the high power level based on an operating mode of the device. The mode control circuitry 392 controls the dual mode LDO circuitry 280 to output either the mid power level or the high power level (e.g., by activating either the mid-power LDO regulator 372 or the high-power LDO 377). In one example, when transitioning between mid-power mode and high-power mode, the mode control circuitry activates the LDO (e.g., either 372 or 377) for the newly selected mode while the LDO for the previous mode (the other of 372 or 377) remains active and providing power. Once the newly activate LDO settles, the mode control circuitry disables the LDO for the previous mode.

The mode control circuitry 392 also communicates the selected mode to the transition control circuitry 397 which enables or disables the first amplifier 240 and the second amplifier 250 to generate the desired clock signal(s). The transition between the mid power state and the high power state is shown in the timing diagram in FIG. 3. It can be seen that upon receiving the transition request (i.e., the lowering of the power down (PD) signal to high power amplifier 250), the transition control circuitry 397 first changes the bias control of the second stage 359 to increase the amount f current the second stage can draw from the dual mode LDO 380 (as illustrated by the transition from the 3'h0 command to the 3'h4 command) and then enables the first stage 352 in a similar manner. In FIG. 3, T1 indicates a transition control step, which includes 3 clock cycles of 38.4 MHz. After the passing of the first T1, the second stage is enabled and in the third T1 the first stage is enabled. At this point, the clock is stable and synchronized to the clock signal output by the first amplifier 240. To complete the transition, the high-power mode LDO 377 is enabled, and once the LDO 377 stable, the mid-power mode LDO 372 is disabled.

In one example, the power level of only the two-level shaper circuitry 220 (FIG. 2) may be switched from mid level to high level while the mid-power mode LDO 372 remains active to provide a fast transition (less than about nanoseconds) and for the very best performance the two-level shaper circuitry 220 and the high-power mode LDO may be switched, which takes about 2 microseconds. Either of these transition times are valid for providing power level control on a per frame basis because a worst case WiFi frame time is 16 microseconds, which is much greater than the 4 microsecond transition time.

Figure 4A:
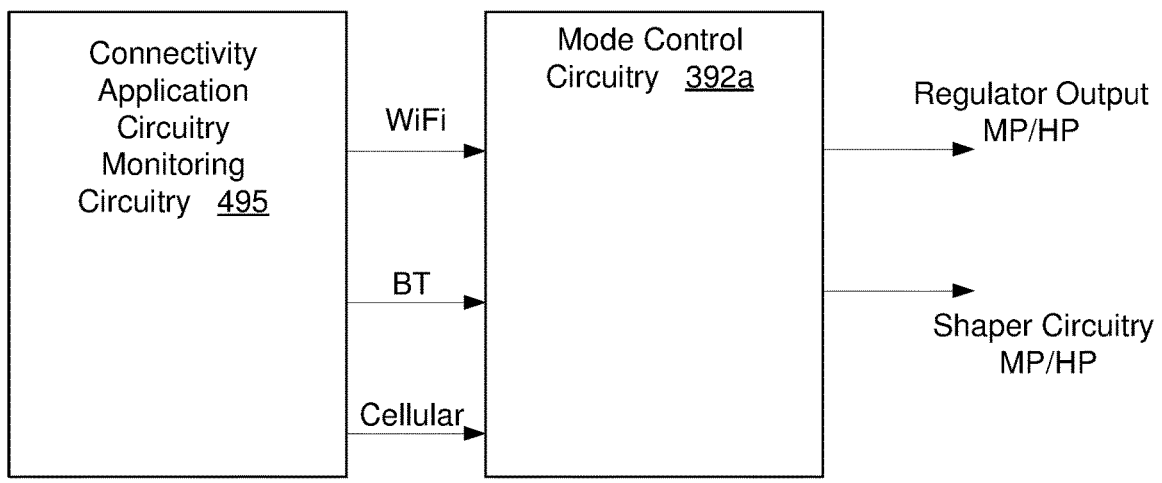
FIGS. 4A and 4B illustrate two different examples of mode control circuitry of the clock signal generation system of FIG. 1.

FIG. 4A illustrates an example mode control circuitry 392a that controls the amount of power output by the dual mode LDO circuitry 280 (FIG. 2) based on information from connectivity application circuitry monitoring circuitry 495. The application monitoring circuitry 495 receives information from connectivity application circuitries or systems, connectivity cores, and so on that utilize the clock signals generated by the clock signal generation system 200 (FIG. 2). For example, the application monitoring circuitry 495 may receive information about an operational state of Bluetooth (BT) connectivity application circuitry, WiFi connectivity application circuitry, and cellular connectivity application circuitry. Table 1 outlines one example control scheme that is used by the mode control circuitry 392a to select the power state based on operational state of Bluetooth and WiFi applications.

TABLE 1

| System usecase | OSC Power Mode | Shaper Power mode | Current consumption | | | |
|---|---|---|---|---|---|---|
| | | | Shaper [uA] | OSC [uA] | Total cc [mA] | % Saving |
| LPM | OFF | LP | 109 | | | |
| BT low power, WiFi beacon | MP | MP | 323 | 305 | 0.63 | 59.4% |
| BT performance, WiFi MCS7 | MP | HP | 770 | 305 | 1.08 | 30.4% |
| HPM, BT/WiFi full performance | HP | HP | 770 | 775 | 1.55 | |

It can be seen from Table 1 that the mode control circuitry 392a controls the dual mode LDO circuitry to provide possibly different levels of power to the generator circuitry 220 (denoted OSC in the table) and the two-level shaper circuitry 230. When the device is not active, the generator circuitry 220 is switched off and a lowest level of power is supplied to the two-level shaper circuitry 230. When the BT connectivity application circuitry is in low power operation and the WiFi application is in beacon operation, themode control circuitry 492a controls the dual mode LDO circuitry 280 to operate the generator circuitry 220 and the two-level shaper circuitry 230 in mid power level, meaning that both circuitries receive the lower quality of regulated power. In one example, the mode control circuitry 392a may control the dual mode LDO circuitry to operate the generator circuitry 220 in mid power level and the two-level shaper circuitry 230 in high power level in certain application operation scenarios, as when the BT connectivity application circuitry is in performance operation and the WiFi connectivity application circuitry is in MCS7 operation. While for the purposes of this description, MCS7 has been used as a cutoff modulation scheme between legacy/"low" modulation rates and high throughput/"modern" rates, any modulation scheme or even other criteria could be used to determine the desired power mode of the device.

In one example not shown in Table 1, the mode control circuitry 392a may control the dual mode LDO circuitry to operate the clock distribution circuitry 260 in a different power state that the generator circuitry 220 and/or the two-level shaper circuitry 230. The current draw of the generator circuitry 220 and/or the two-level shaper circuitry 230 is illustrated in Table 1, and it can be seen that there is significant power savings when operating at least one circuitry in mid power mode as compared to operating all circuitries in high power mode.

Figure 4B:
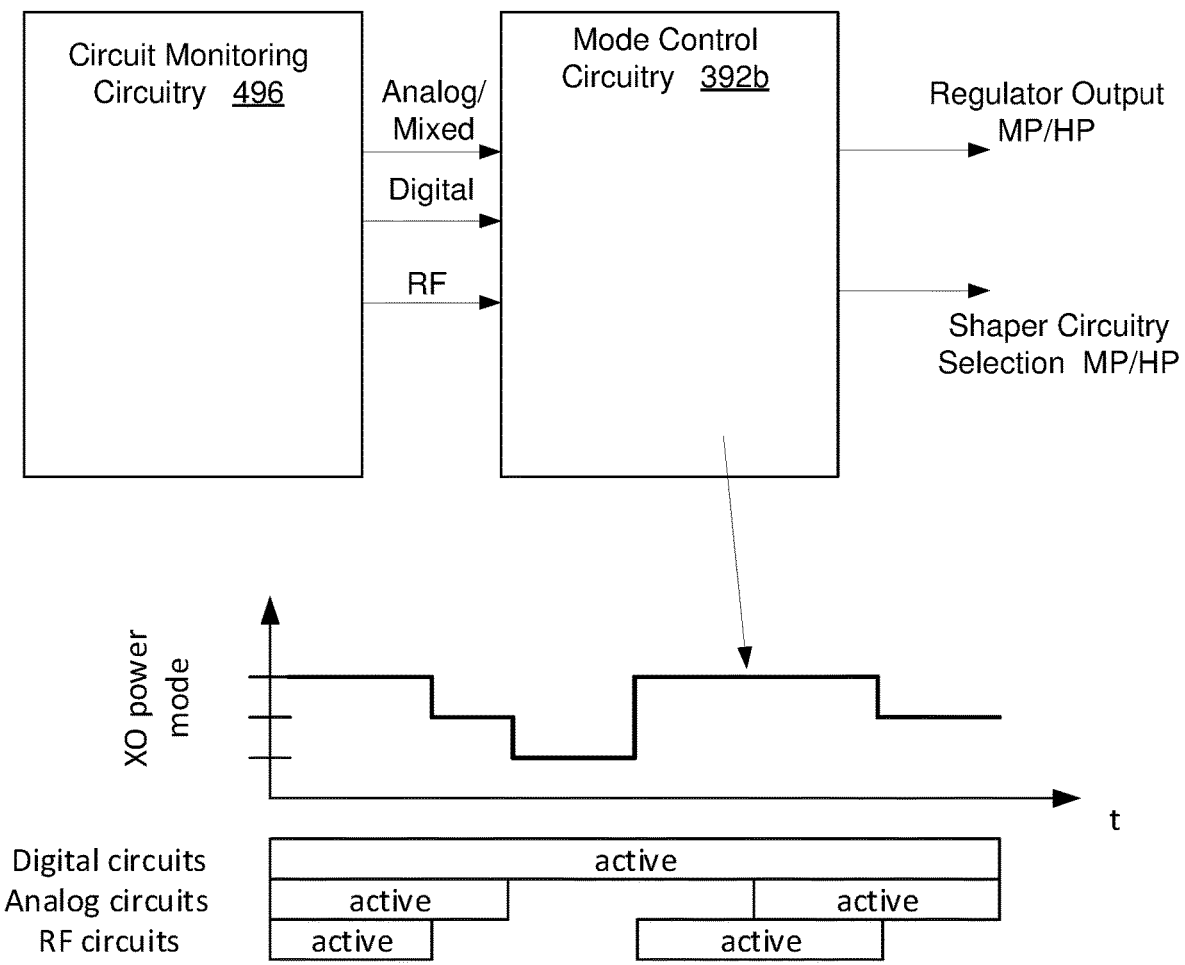

FIG. 4B illustrates another example of mode control circuitry 392b that controls the power state based on information received from circuit monitoring circuitry 496 that determines whether various types of circuits are active in the device. This control scheme reduces the power consumption of the system 200 especially in the use cases with limited RF activity but long 'digital only' processing time. For example during a VoLTE call, the time with RF activity is low compared to the device active time. This is due to the fact, that the audio processing circuits which pre- and post-process the received and transmitted audio packets require only a digital low performance clock. In a VoLTE scenario, the mid power mode could be used in 70% of the time, which could save ~1.5 mW.

The control scenario illustrated in FIG. 4B dynamically adapts the performance (and hence the power consumption) of the XO during active phases dependent on the current requirements. The device includes several different components (digital logic, analog logic/mixed-signal logic, RF) that are connected to the clock distribution logic 260 which receives the clock signals from the oscillator circuitry 210. All of these components have different requirement regarding the clock performance (e.g. phase noise, jitter, stability . . . ). Typically, RF circuits have the highest clock requirements whereas pure digital logic can be operated with less stable clocks.

The connected components can request clock signals from the clock signal generation system 200. As long as at least one component requests a clock signal, the oscillator circuitry 210 is active. Only when all components release the clock request, the generator circuitry 220 can be switched off completely or a low power XO (either a separate on or a dedicate low-power mode of the main XO) can be used for power save reasons. This low power XO is required to maintain wake-up times during sleep phases and is only used, when no clocks except for the timers are requested.

The circuit monitoring circuitry 496 monitors component requests for their required clock performance dependent on their current operational state and detects each time the performance requirements change. In one example, one or a combination of the following parameters are used to indicate the clock performance to the mode control circuitry 392b: maximum allowed jitter, maximum allowed phase noise, maximum allowed time drift, required duty cycle, minimum required rise and fall times, required amplitude, required temperature stability, maximum allowed frequency offset. The mode control circuitry 392b combines all those inputs and adapts the power state of the system 200 accordingly. A look-up table allows to select the lowest performance mode which matches all the performance requirements of all registered components.

In another example, the power state switching performed by the mode control circuitry 392b is based on which circuits are active. The assumption is that RF circuits have the highest clock performance requirements and pure digital circuit have the lowest requirements. The control diagram shown in FIG. 3 illustrates the selected power state dependent on the request by the different components. As long as the RF circuits are active, that highest power state is used. The mid power state is used when only analog or digital circuits are active. A mid-low power state is used when only the digital circuits are active.

Dependent on the clock requirements of several components of the system, not only the performance of the system 200 but also the performance and with it the power consumption of the clock distribution network can be adapted. This includes for example the dynamic adjustment of the driver strength of the clock buffers or the configuration of the PLLs (not shown).

In one example, the components report not only the clock requirements to the circuit monitoring circuitry 496 but also the expected time duration how long the clock requirements will be valid until another performance mode will be activated. With this information the mode control circuitry 392b may judge if a power state change is beneficial taking into account the power saving for a given time and the required power for the state change. Based on this information the mode control circuitry 392b can optimize the overall power consumption.

Figure 5:
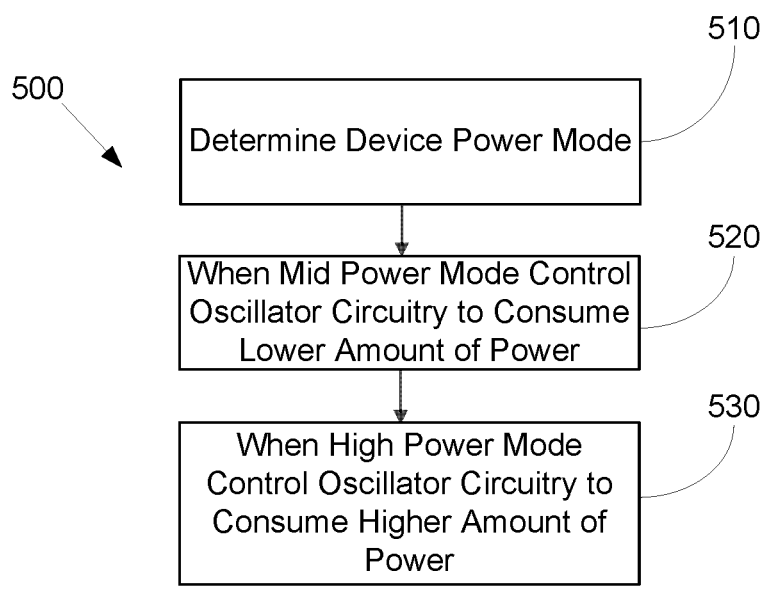
FIG. 5 illustrates a flow diagram of an exemplary method for generating different clock signals of different qualities in a device in accordance with various aspects described.

FIG. 5 illustrates a flow diagram that outlines a method 500 to generate different clock signals of different qualities in a device. The method may be performed by the system 100 or the system 200 of FIGS. 1 and 2, respectively. At 510 the method includes determining whether the device is operating in a mid power mode or a high power mode. 510 may be performed by control circuitry 190 or 290 of FIGS. 1-4. At 520, in response to determining that the device is operating in the mid power mode, the method includes controlling oscillator circuitry to cause the oscillator circuitry to consume a lower amount of power, such that the oscillator circuitry generates a lower quality clock signal. At 530, the method includes, in response to determining that the device is operating in the high power mode, controlling the oscillator circuitry to cause the oscillator circuitry to consume a higher amount of power, such that the oscillator circuitry generates a higher quality clock signal. 520 and 530 may be performed by control circuitry 190, 290, 390 of FIGS. 1-3, respectively.

It can be seen from the foregoing description that the described systems, methods, and circuitries support switching between two oscillator circuitry power states for current consumption of performance optimization. The example systems, methods, and circuitries improve power consumption by about 60% on beacon or low rate wireless communication as compared to full time operation in the high power state. As a result, the systems, methods, and circuitries are capable of delivering state of the art performance, as required for high-end connectivity solutions, and when needed, providing power optimized operation for legacy or low rate device modes. The same oscillator is used to lower the transition time between the mid power state and the high power state and reducing the complexity of the control scheme. The analog mechanisms used result in zero glitch/clock phase shift during power state transitions. The example systems, methods, and circuities ensure low clock frequency shift high power state operation and mid power state operation of plus or minus 1 part per million (PPM), with negligible impact on clock frequency stability budget and eliminating the need for an extra capacitor tuning calibration.

Figure 6:
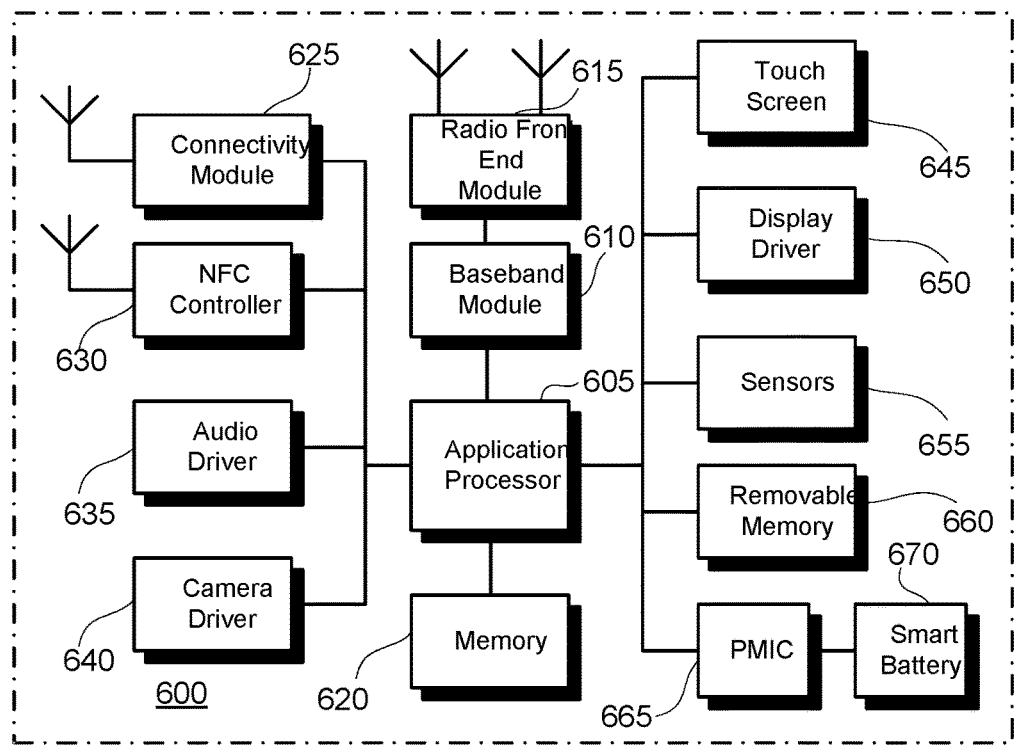
FIG. 6 illustrates an example device that may include a clock signal generation system in accordance with various aspects described.

FIG. 6 illustrates a user device 600 in accordance with an aspect. The user device 600 may be a mobile device in some aspects and includes an application processor 605, baseband processor 610 (also referred to as a baseband module), radio front end module (RFEM) 615, memory 620, connectivity module 625, near field communication (NFC) controller 630, audio driver 635, camera driver 640, touch screen 645, display driver 650, sensors 655, removable memory 660, power management integrated circuit (PMIC) 665 and smart battery 670.

In some aspects, application processor 605 may include, for example, one or more CPU cores and one or more of cache memory, low drop-out voltage regulators (LDOs), interrupt controllers, serial interfaces such as serial peripheral interface (SPI), inter-integrated circuit (I2C) or universal programmable serial interface module, real time clock (RTC), timer-counters including interval and watchdog timers, general purpose input-output (IO), memory card controllers such as secure digital/multi-media card (SD/MMC) or similar, universal serial bus (USB) interfaces, mobile industry processor interface (MIPI) interfaces and Joint Test Access Group (JTAG) test access ports.

In some aspects, baseband module 610 may be implemented, for example, as a solder-down substrate including one or more integrated circuits, a single packaged integrated circuit soldered to a main circuit board, and/or a multi-chip module containing two or more integrated circuits.

Figure 7:
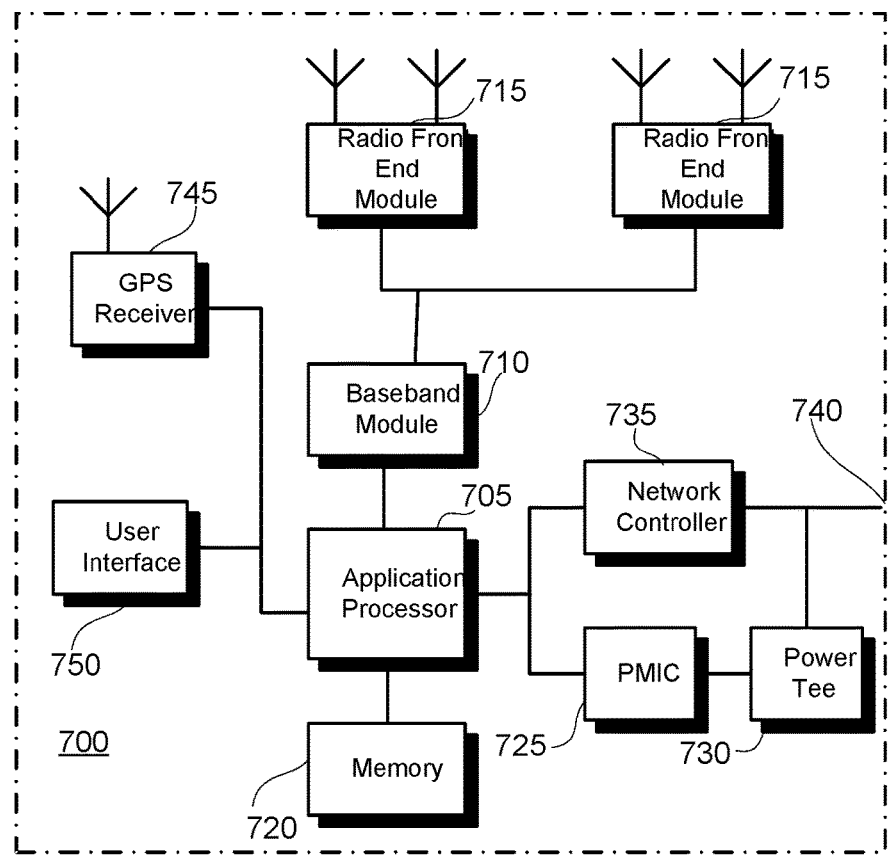
FIG. 7 illustrates an example basestation that may include a clock signal generation system in accordance with various aspects described.

FIG. 7 illustrates a base station or infrastructure equipment radio head 700 in accordance with an aspect. The base station radio head 700 may include one or more of application processor 705, baseband modules 710, one or more radio front end modules 715, memory 720, power management circuitry 725, power tee circuitry 730, network controller 735, network interface connector 740, satellite navigation receiver module 745, and user interface 750.

In some aspects, application processor 705 may include one or more CPU cores and one or more of cache memory, low drop-out voltage regulators (LDOs), interrupt controllers, serial interfaces such as SPI, 120 or universal programmable serial interface module, real time clock (RTC), timer-counters including interval and watchdog timers, general purpose IO, memory card controllers such as SD/MMC or similar, USB interfaces, MIPI interfaces and Joint Test Access Group (JTAG) test access ports.

In some aspects, baseband processor 710 may be implemented, for example, as a solder-down substrate including one or more integrated circuits, a single packaged integrated circuit soldered to a main circuit board or a multi-chip module containing two or more integrated circuits.

In some aspects, memory 720 may include one or more of volatile memory including dynamic random access memory (DRAM) and/or synchronous dynamic random access memory (SDRAM), and nonvolatile memory (NVM) including high-speed electrically erasable memory (commonly referred to as Flash memory), phase change random access memory (PRAM), magnetoresistive random access memory (MRAM) and/or a three-dimensional crosspoint memory. Memory 720 may be implemented as one or more of solder down packaged integrated circuits, socketed memory modules and plug-in memory cards.

In some aspects, power management integrated circuitry 725 may include one or more of voltage regulators, surge protectors, power alarm detection circuitry and one or more backup power sources such as a battery or capacitor. Power alarm detection circuitry may detect one or more of brown out (under-voltage) and surge (over-voltage) conditions.

In some aspects, power tee circuitry 730 may provide for electrical power drawn from a network cable to provide both power supply and data connectivity to the base station radio head 700 using a single cable.

In some aspects, network controller 735 may provide connectivity to a network using a standard network interface protocol such as Ethernet. Network connectivity may be provided using a physical connection which is one of electrical (commonly referred to as copper interconnect), optical or wireless.

In some aspects, satellite navigation receiver module 745 may include circuitry to receive and decode signals transmitted by one or more navigation satellite constellations such as the global positioning system (GPS), Globalnaya Navigatsionnaya Sputnikovaya Sistema (GLONASS), Galileo and/or BeiDou. The receiver 745 may provide data to application processor 705 which may include one or more of position data or time data. Application processor 705 may use time data to synchronize operations with other radio base stations.

In some aspects, user interface 750 may include one or more of physical or virtual buttons, such as a reset button, one or more indicators such as light emitting diodes (LEDs) and a display screen.

Use of the word exemplary is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form. Furthermore, to the extent that the terms "including", "includes", "having", "has", "with", or variants thereof are used in either the detailed description and the claims, such terms are intended to be inclusive in a manner similar to the term "comprising".

Examples herein can include subject matter such as a method, means for performing acts or blocks of the method, at least one machine-readable medium including executable instructions that, when performed by a machine (e.g., a processor with memory or the like) cause the machine to perform acts of the method or of an apparatus or system for concurrent communication using multiple communication technologies according to embodiments and examples described.

Example 1 is a method to generate different clock signals of different qualities in a device. The method includes determining whether the device is operating in a mid power mode or a high power mode. In response to determining that the device is operating in the mid power mode, oscillator circuitry is controlled to cause the oscillator circuitry to consume a lower amount of power, such that the oscillator circuitry generates a lower quality clock signal. In response to determining that the device is operating in the high power mode, the oscillator circuitry is controlled to cause the oscillator circuitry to consume a higher amount of power, such that the oscillator circuitry generates a higher quality clock signal. The lower amount of power and the higher amount of power are different from one another.

Example 2 includes the subject matter of example 1, including or omitting optional elements, including determining the power mode of the device on a per frame basis.

Example 3 includes the subject matter of example 1, including or omitting optional elements, including determining whether the device is operating in the mid power mode or the high power mode based on a mode of operation of one or more circuitries in the device.

Example 4 includes the subject matter of examples 1-3, including or omitting optional elements, including determining that the device is -operating in the mid power mode when a Bluetooth connectivity application circuitry in the device is operating in a low power mode and a wireless fidelity (WiFi) connectivity application circuitry in the device is operating in a beacon mode.

Example 5 includes the subject matter of examples 1-3, including or omitting optional elements, including determining that the device is operating in the high power mode when a Bluetooth connectivity application circuitry in the device is operating in a performance mode and a wireless fidelity (WiFi) application in execution on the device is operating in a full performance mode.

Example 6 includes the subject matter of examples 1-3, including or omitting optional elements, including when the device is in mid power mode providing a lower quality regulated power to one or more circuitries that generate the clock signals.

Example 7 includes the subject matter of examples 1-3, including or omitting optional elements, including when the device is in high power mode providing a higher quality regulated power to one or more circuitries that generate the clock signals.

Example 8 includes the subject matter of examples 1-3, including or omitting optional elements, including determining that the device is operating in a mid-high power mode when a Bluetooth connectivity application circuitry in the device is operating in a performance mode and a wireless fidelity (WiFi) connectivity application circuitry in the device is operating according to a high modulation scheme, and in response, controlling the oscillator circuitry to consume a mid-high amount of power that is more than the lower amount of power and less than the higher amount of power.

Example 9 includes the subject matter of example 8, including or omitting optional elements, including when the device is in the mid-high power mode, providing a lower quality of regulated power to an oscillator amplifier and a higher quality of regulated power to shaper circuitry that shapes an output of the oscillator amplifier.

Example 10 includes the subject matter of examples 1-3, including or omitting optional elements, including determining whether digital circuits, analog circuits, and radio frequency (RF) circuits in the device are active; and based on the determination, determining whether the device is operating in the mid power mode or the high power mode.

Example 11 includes the subject matter of example 10, including or omitting optional elements, including determining that the device is operating in the high power mode when the radio frequency circuits are active.

Example 12 includes the subject matter of example 10, including or omitting optional elements, including determining that the device is operating in the mid power mode when the analog circuits are active and the radio frequency circuits are not active.

Example 13 includes the subject matter of example 10, including or omitting optional elements, including determining that a respective one of the digital circuits, the analog circuits, or the radio frequency (RF) circuits is active when a clocking request is received from the respective one of the digital circuits, the analog circuits, and the radio frequency (RF) circuits.

Example 14 includes the subject matter of example 10, including or omitting optional elements, including determining that a respective one of the digital circuits, the analog circuits, or the radio frequency (RF) circuits is not active when a clocking request is not received from the respective one of the digital circuits, the analog circuits, and the radio frequency (RF) circuits.

Example 15 is a clock signal generation system for a device, including generator circuitry, two-level shaper circuitry, multi-mode regulator circuitry, and control circuitry. The generator circuitry is configured to generate a sinusoidal signal having a predetermined frequency. The two-level shaper circuitry is configured to shape the sinusoidal signal to generate a first clock signal or a second clock signal, wherein the first clock signal is characterized by a lower quality than the second clock signal. The multi-mode regulator circuitry is configured to provide a selected one of a lower level of power or a higher level of power to the generator circuitry and the two-level shaper circuitry. The control circuitry is configured to control the generator circuitry, the two-level shaper circuitry, and the multi-mode regulator circuitry, based on a mode selection, to generate and output a selected one of the first clock signal or the second clock signal as an output clock signal.

Example 16 includes the subject matter of example 15, including or omitting optional elements, wherein the two-level shaper circuitry includes mid power circuitry configured to shape the sinusoidal signal to generate the first clock signal and high power circuitry configured to shape the sinusoidal signal to generate the second clock signal.

Example 17 includes the subject matter of example 15, including or omitting optional elements, wherein the high power circuitry includes a first amplifier stage and a second amplifier stage that shape the sinusoidal signal and the control circuitry includes transition control circuitry configured to, in response to the device transitioning from a mid power mode to a high power mode, provide the higher level of power to the second amplifier stage and then to both the first amplifier stage and the second amplifier stage.

Example 18 includes the subject matter of example 15, including or omitting optional elements, wherein the multi-mode regulator circuitry includes a mid-power mode low dropout (LDO) regulator that consumes a first amount of power and is controlled by the control circuitry to output a lower quality of regulated power to provide the mid power level; and a high-power mode LDO regulator that consumes a second amount of power and is controlled by the control circuitry to output a higher quality of regulated power to provide the high power level. The first amount of power is less than the second amount of power.

Example 19 includes the subject matter of examples 15-18, including or omitting optional elements, wherein the control circuitry includes mode control circuitry configured to determine whether the device is operating in a mid power mode in which the first clock signal is output or a high power mode in which the second clock signal is output based on a mode of operation of one or more connectivity application circuitries in the device.

Example 20 includes the subject matter of examples 15-18, including or omitting optional elements, wherein the control circuitry includes mode control circuitry configured to determine whether the device is operating in a mid power mode in which the first clock signal is output or a high power mode in which the second clock signal is output based on whether digital circuits, analog circuits, and radio frequency (RF) circuits in the device are active.

Example 21 includes the subject matter of examples 15-18, including or omitting optional elements, further including clock distribution circuitry configured to select one of the first clock signal or the second clock signal as an output clock signal and wherein the multi-mode regulator circuitry is configured to provide the selected one of a lower level of power or a higher level of power to the clock distribution circuitry.

Example 22 is oscillator circuitry, including control circuitry configured to determine a mode of operation of a device that uses clock signals generated by the oscillator circuitry and multi-mode regulator circuitry configured to output either a mid level of power or a high level of power based at least on the determined mode of operation. The multi-mode regulator circuitry consumes a lower amount of power when outputting the mid level of power and a higher amount of power when outputting the high level of power. The oscillator circuitry generates a first clock signal having a lower quality in response to the mid level of power and a second clock signal having a higher quality in response to the high level of power.

Example 23 includes the subject matter of example 22, including or omitting optional elements, further including generator circuitry configured to receive power from the multi-mode regulator circuitry and generate a sinusoidal signal having a predetermined frequency and two-level shaper circuitry configured to receive power from the multi-mode regulator circuitry and shape the sinusoidal signal into a clock signal. The generator circuitry and the two-level shaper circuitry are configured to generate the first clock signal in response to the mid level of power and to generate the first clock signal in response to the high level of power.

Example 24 includes the subject matter of examples 22-23, including or omitting optional elements, wherein the control circuitry is configured to determine whether the device is operating in a mid power mode in which the first clock signal is output or a high power mode in which the second clock signal is output based on a mode of operation of one or more connectivity application circuitries in the device.

Example 25 includes the subject matter of examples 22-23, including or omitting optional elements, wherein the control circuitry is configured to determine whether the device is operating in a mid power mode in which the first clock signal is output or a high power mode in which the second clock signal is output based on whether digital circuits, analog circuits, and radio frequency (RF) circuits in the device are active.

It is to be understood that aspects described herein may be implemented by hardware, software, firmware, or any combination thereof. When implemented in software, functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a general purpose or special purpose computer.

Various illustrative logics, logical blocks, modules, and circuits described in connection with aspects disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform functions described herein. A general-purpose processor may be a microprocessor, but, in the alternative, processor may be any conventional processor, controller, microcontroller, or state machine. A processor may also be implemented as a combination of computing devices, for example, a combination of a DSP and a microprocessor, a plurality of microprocessors, one or more microprocessors in conjunction with a DSP core, or any other such configuration. Additionally, at least one processor may include one or more modules operable to perform one or more of the acts and/or actions described herein.

For a software implementation, techniques described herein may be implemented with modules (e.g., procedures, functions, and so on) that perform functions described herein. Software codes may be stored in memory units and executed by processors. Memory unit may be implemented within processor or external to processor, in which case memory unit can be communicatively coupled to processor through various means as is known in the art. Further, at least one processor may include one or more modules operable to perform functions described herein.

Further, the acts and/or actions of a method or algorithm described in connection with aspects disclosed herein may be embodied directly in hardware, in a software module executed by a processor, or a combination thereof. A software module may reside in RAM memory, flash memory, ROM memory, EPROM memory, EEPROM memory, registers, a hard disk, a removable disk, a CD-ROM, or any other form of storage medium known in the art. An exemplary storage medium may be coupled to processor, such that processor can read information from, and write information to, storage medium. In the alternative, storage medium may be integral to processor. Further, in some aspects, processor and storage medium may reside in an ASIC. Additionally, ASIC may reside in a user terminal. In the alternative, processor and storage medium may reside as discrete components in a user terminal. Additionally, in some aspects, the acts and/or actions of a method or algorithm may reside as one or any combination or set of codes and/or instructions on a machine-readable medium and/or computer readable medium, which may be incorporated into a computer program product.

In this regard, while the disclosed subject matter has been described in connection with various embodiments and corresponding Figures, where applicable, it is to be understood that other similar embodiments can be used or modifications and additions can be made to the described embodiments for performing the same, similar, alternative, or substitute function of the disclosed subject matter without deviating therefrom. Therefore, the disclosed subject matter should not be limited to any single embodiment described herein, but rather should be construed in breadth and scope in accordance with the appended claims below.

What is claimed is:

1. A method to generate different clock signals of-different qualities in a device, the method comprising:
    determining a power mode in which the device is operating; and
    based on the power mode of the device,
        controlling oscillator circuitry to cause the oscillator circuitry to consume either a lower amount of power or a higher amount of power, the oscillator circuitry being configured to generate an oscillator signal, and
        controlling, independently of the controlling of the oscillator circuitry, a shaper circuitry having a first amplifier stage and a second amplifier stage that shape the oscillator signal, to consume either the lower amount of power or the higher amount of power, wherein the lower amount of power and the higher amount of power are different from one another, and
when controlling the shaper circuitry to transition from consuming the lower amount of power to consuming the higher amount of power, providing the higher amount of power to second amplifier stage and then to both the first amplifier stage and the second amplifier stage.

2. The method of claim 1, comprising switching between power modes of the device within a WiFi frame time.

3. The method of claim 1, comprising determining the power mode of the device based on a mode of operation of one or more circuitries in the device.

4. The method of claim 1, comprising in response to determining that a Bluetooth connectivity application circuitry in the device is operating in a low power mode and a wireless fidelity (WiFi) connectivity application circuitry in the device is operating in a beacon mode, controlling the oscillator circuitry to consume the lower amount of power and controlling the shaper circuitry to consume the lower amount of power.

5. The method of claim 1, comprising in response to determining that a Bluetooth connectivity application circuitry in the device is operating in a performance mode and a wireless fidelity (WiFi) application in execution on the device is operating in a full performance mode, controlling the oscillator circuitry to consume the higher amount of power and controlling the shaper circuitry to consume the higher amount of power.

6. The method of claim 1, comprising in response to determining that a Bluetooth connectivity application circuitry in the device is operating in a performance mode and a wireless fidelity (WiFi) connectivity application circuitry in the device is operating according to a high modulation scheme, controlling the oscillator circuitry to consume the lower amount of power and controlling the shaper circuitry to consume the higher amount of power.

7. The method of claim 1, comprising determining the power mode of the device based on whether digital circuits, analog circuits, and radio frequency (RF) circuits in the device are active.

8. The method of claim 7, comprising in response to determining that the radio frequency (RF) circuits are active, controlling the oscillator circuitry to consume the higher amount of power and controlling the shaper circuitry to consume the higher amount of power.

9. The method of claim 7, comprising in response to determining that the analog circuits are active and the radio frequency (RF) circuits are not active, controlling the oscillator circuitry to consume the lower amount of power and controlling the shaper circuitry to consume the lower amount of power.

10. The method of claim 7, comprising determining that a respective one of the digital circuits, the analog circuits, or the radio frequency (RF) circuits is active when a clocking request is received from the respective one of the digital circuits, the analog circuits, and the radio frequency (RF) circuits.

11. The method of claim 7, comprising determining that a respective one of the digital circuits, the analog circuits, or the radio frequency (RF) circuits is not active when a clocking request is not received from the respective one of the digital circuits, the analog circuits, and the radio frequency (RF) circuits.

12. A clock signal generation system for a device, comprising:
control circuitry;
generator circuitry configured to generate a signal having a predetermined frequency;
two-level shaper circuitry configured to shape the signal to generate a first clock signal or a second clock signal, wherein the first clock signal is characterized by a lower quality than the second clock signal, the two-level shaper circuitry having a first amplifier stage and a second amplifier stage that shape the signal;
multi-mode regulator circuitry having
a mid-power mode low dropout (LDO) regulator that consumes a first amount of power and is activated by the control circuitry to provide a lower power level; and
a high-power mode LDO regulator that consumes a second amount of power and is activated by the control circuitry to provide a higher power level,
the multi-mode regulator circuitry being configured to provide a selected one of the lower power level or the higher power level to the generator circuitry and a selected one of the lower power level or the higher power level to the two-level shaper circuitry; and
the control circuitry being configured to control the generator circuitry, the two-level shaper circuitry, and the multi-mode regulator circuitry, based on a mode selection, to generate and output a selected one of the first clock signal or the second clock signal as an output clock signal,
the control circuitry being further configured to, in response to the device transitioning from a mid power mode to a high power mode, provide the higher power level to the second amplifier stage and then to both the first amplifier stage and the second amplifier stage.

13. The clock signal generation system of claim 12, wherein the two-level shaper circuitry comprises:
mid power circuitry configured to shape the signal to generate the first clock signal; and
high power circuitry configured to shape the signal to generate the second clock signal.

14. The clock signal generation system of claim 12, wherein the control circuitry comprises mode control circuitry configured to determine whether the device is operating in a mid power mode in which the first clock signal is output or a high power mode in which the second clock signal is output based on a mode of operation of one or more connectivity application circuitries in the device.

15. The clock signal generation system of claim 12, wherein the control circuitry comprises mode control circuitry configured to determine whether the device is operating in a mid power mode in which the first clock signal is output or a high power mode in which the second clock signal is output based on whether digital circuits, analog circuits, and radio frequency (RF) circuits in the device are active.

16. The clock signal generation system of claim 12, further comprising:
clock distribution circuitry configured to select one of the first clock signal or the second clock signal as an output clock signal; and
wherein the multi-mode regulator circuitry is configured to provide the selected one of a lower power level power or a higher power level to the clock distribution circuitry.

17. Oscillator circuitry, comprising:
control circuitry configured to determine a mode of operation of a device that uses clock signals generated by the oscillator circuitry;

multi-mode regulator circuitry configured to output one of a first power level or a second power level based on the mode of operation, the first power level being lower than the second power level;

generator circuitry configured to receive power from the multi-mode regulator circuitry at one of the first power level or the second power level and, in response, generate a signal; and two-level shaper circuitry configured to receive power from the multi-mode regulator circuitry at one of the first power level or the second power level and shape the signal into a clock signal, the two-level shaper circuitry having:

mid power circuitry configured to generate a first clock signal based on the signal, and high power circuitry configured to generate a second clock signal based on the signal, the second clock signal having a higher quality than the first clock signal, the high power circuitry having a first amplifier stage and a second amplifier stage that shape the signal; and the control circuitry being configured to, in response to the device transitioning from a mid power mode to a high power mode, provide the second power level to the second amplifier stage and then to both the first amplifier stage and the second amplifier stage.

18. The oscillator circuitry of claim 17, wherein the control circuitry is configured to determine whether the device is operating in a mid power mode in which the first clock signal is output or a high power mode in which the second clock signal is output based on a mode of operation of one or more connectivity application circuitries in the device.

19. The oscillator circuitry of claim 17, wherein the control circuitry is configured to determine whether the device is operating in a mid power mode in which the first clock signal is output or a high power mode in which the second clock signal is output based on whether digital circuits, analog circuits, and radio frequency (RF) circuits in the device are active.

\* \* \* \* \*